(12) United States Patent
Tamura (10) Patent No.: US 11,221,363 B2
(45) Date of Patent: Jan. 11, 2022

(54) TEST DEVICE, TEST METHOD, AND MEMORY MEDIUM

(71) Applicant: TOKYO ELECTRON LIMITED, Tokyo (JP)

(72) Inventor: Muneaki Tamura, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 170 days.

(21) Appl. No.: 16/633,789

(22) PCT Filed: Jul. 17, 2018

(86) PCT No.: PCT/JP2018/026724
§ 371 (c)(1),
(2) Date: Jan. 24, 2020

(87) PCT Pub. No.: WO2019/026607
PCT Pub. Date: Feb. 7, 2019

(65) Prior Publication Data
US 2020/0241069 A1    Jul. 30, 2020

(30) Foreign Application Priority Data

Jul. 31, 2017 (JP) .............................. JP2017-148199

(51) Int. Cl.
*G01R 31/00*    (2006.01)
*G01R 31/28*    (2006.01)
(Continued)

(52) U.S. Cl.
CPC ..... *G01R 31/2891* (2013.01); *G01N 21/8806* (2013.01); *G01R 1/0408* (2013.01);
(Continued)

(58) Field of Classification Search
CPC ............ G01R 31/2891; G01R 31/2887; G01R 31/2893; G01R 31/2886; G01R 1/0408;
(Continued)

(56) References Cited

U.S. PATENT DOCUMENTS

| 2007/0132468 A1* | 6/2007 | Nakayama | G01R 31/2891 324/750.22 |
| 2010/0237894 A1* | 9/2010 | Sano | G01R 31/2891 324/762.05 |
| 2017/0219625 A1* | 8/2017 | Saiki | G01R 31/2891 |

FOREIGN PATENT DOCUMENTS

| JP | 7-147304 A | 6/1995 |
| JP | 2016-111175 A | 6/2016 |

* cited by examiner

*Primary Examiner* — Raul J Rios Russo
(74) *Attorney, Agent, or Firm* — Nath, Goldberg & Meyer; Jerald L. Meyer; Tanya E. Harkins (57) ABSTRACT

A test device for testing a needle mark generated in an electrode formed in a test object when a probe needle contacts the electrode includes an imaging part having a binning function, and a controller configured to control at least the imaging part. The controller is configured to perform a high-speed low-precision test process of imaging the electrode, after a contact operation by the probe needle, by the imaging part whose binning function is on, and determining a state of the needle mark of the electrode, based on an imaging result, and a low-speed high-precision test process of imaging the electrode again by the imaging part whose binning function is off, according to a determination result in the high-speed low-precision test process, and determining a state of the needle mark of the electrode imaged again, based on an imaging result.

16 Claims, 7 Drawing Sheets

(51) Int. Cl.
*G01N 21/88* (2006.01)
*G01R 1/04* (2006.01)
(52) U.S. Cl.
CPC ..... *G01R 31/2886* (2013.01); *G01R 31/2887* (2013.01); *G01R 31/2889* (2013.01); *G01R 31/2893* (2013.01); *H01L 2924/00* (2013.01); *H01L 2924/0002* (2013.01)
(58) Field of Classification Search
CPC ........ G01R 31/2889; H01L 2924/0002; H01L 2924/00; G01N 21/8806; G01N 2021/8867; G01N 21/8851; G01N 2021/8887; G06T 7/0004
USPC ......... 324/71, 378, 403, 415, 425, 500, 537, 324/750.16
See application file for complete search history.

TEST DEVICE, TEST METHOD, AND MEMORY MEDIUM

CROSS-REFERENCE TO RELATED APPLICATION

This application is based on and claims priority to Japanese Patent Application No. 2017-148199, filed on Jul. 31, 2017, in the Japan Patent Office, the disclosure of which is herein incorporated by reference in its entirety.

The present disclosure relates to a test device, a test method, and a memory medium for testing a needle mark generated in an electrode formed in a test object when a probe needle contacts the electrode.

BACKGROUND

In a semiconductor manufacturing process, a plurality of semiconductor devices having a predetermined circuit pattern are formed on a semiconductor wafer. Inspections, for example, of electrical characteristics of the formed semiconductor devices are performed to classify the semiconductor devices into good products and defective products. The test of the electrical characteristics of a semiconductor device is performed using a probe device (hereinafter, a prober) in a state of a semiconductor wafer before the semiconductor devices are divided. The prober is provided with a probe card having a plurality of probe needles. After aligning probe needles and electrodes such that the probe needles provided in the probe card contact electrodes (for example, pads) provided on a semiconductor device, the probe card in the prober and a semiconductor device are made to approach each other. Further, the prober supplies an electric signal to the semiconductor device through the probe needles in the state in which the probe needle contacts the electrodes, and determinations of whether the semiconductor device is a defective product on the basis of an electric signal output from the semiconductor device through the probe needles are performed.

However, even when the probe needles and the electrodes are precisely aligned, a probe needle may deviate from the electrode due to a change accompanied by thermal expansion or thermal contraction of a wafer or a state on which the wafer is loaded by a temperature change of the prober, or an elastic deterioration by an overtime change of the probe needle of the probe card. In this way, if a deviation occurs, a flaw such as a crack may be caused on a film around the electrode. The flawed semiconductor device should be excluded as a defective product even when it was determined that it is not a defective product.

Accordingly, determination of whether a needle mark caused when bringing the electrode into contact with the probe needle is good/bad is performed by imaging the needle mark generated in the electrode by an imaging device (see patent document 1).

PRIOR ART DOCUMENTS

Patent Documents

Japanese Patent Application Publication No. H07-147304

SUMMARY

However, although a magnification during imaging in a test of a needle mark is not described in patent document 1, it is considered that imaging is made at a single magnification. If a magnification is low in the case of imaging with a single magnification, the test cannot be performed with an accuracy of miniaturization that is recently required, and if the magnification is high, a high capacity is required for a controller that processes an output from an imaging device, which increases costs. Although it is considered that a plurality of optical systems having lenses of different magnifications and a mechanism for switching the optical systems are provided in the prober for a test and the optical system is switched for a needle mark test with a high precision and a needle mark test with a low precision, providing such mechanism separately for the test is not preferable in terms of reliability, considering the possibility that the mechanism may break down.

The present disclosure has been made in consideration of the situation, and has an objective to provide a test device and a test method for testing a needle mark generated in an electrode, which is formed in a test object when a probe needle contacts the electrode, with a high reliability at low costs.

An aspect of the present disclosure is a test device for testing a needle mark generated in an electrode formed in a test object when a probe needle contacts the electrode including an imaging part having a binning function, and a controller configured to control at least the imaging part. The controller is configured to perform a high-speed low-precision test process of imaging the electrode after a contact operation by the probe needle by the imaging part whose binning function is on, and determining a state of the needle mark of the electrode, based on an imaging result, and a low-speed high-precision test process of imaging the electrode again by the imaging part whose binning function is off, according to a determination result in the high-speed/low-precision test process, and determining a state of the needle mark of the electrode imaged again, based on an imaging result.

Another aspect of the present disclosure is test method using a test device for testing a needle mark generated in an electrode formed in a test object when a probe needle contacts the electrode. The test device includes an imaging part having a binning function. The test method includes a high-speed low-precision test process of imaging the electrode, after a contact operation by the probe needle, by the imaging part whose binning function is on, and determining a state of the needle mark of the electrode, based on an imaging result, and a low-speed high-precision test process of imaging the electrode again by the imaging part whose binning function is off, according to a determination result in the high-speed low-precision test process, and determining a state of the needle mark of the electrode imaged again, based on an imaging result.

Another aspect of the present disclosure is a computer readable memory medium that stores a program that is operated on a computer of a controller that controls a test device such that a test method is executed by the test device.

Another aspect of the present disclosure is a test device for testing a test object by bringing a probe needle into contact with an electrode formed in the test object and supplying an electric signal to the test object through the probe needle, the test device including an imaging part having a binning function, and an optical system for imaging by the imaging part at a resolution lower than an virtual resolution that is available when the binning function is on.

An aspect of the present disclosure provides a test device and a test method for testing a needle mark generated in an electrode, which is formed in a test object when a probe needle contacts the electrode, thereby enabling high precision and reliability at low costs.

DETAILED DESCRIPTION

Figure 1:
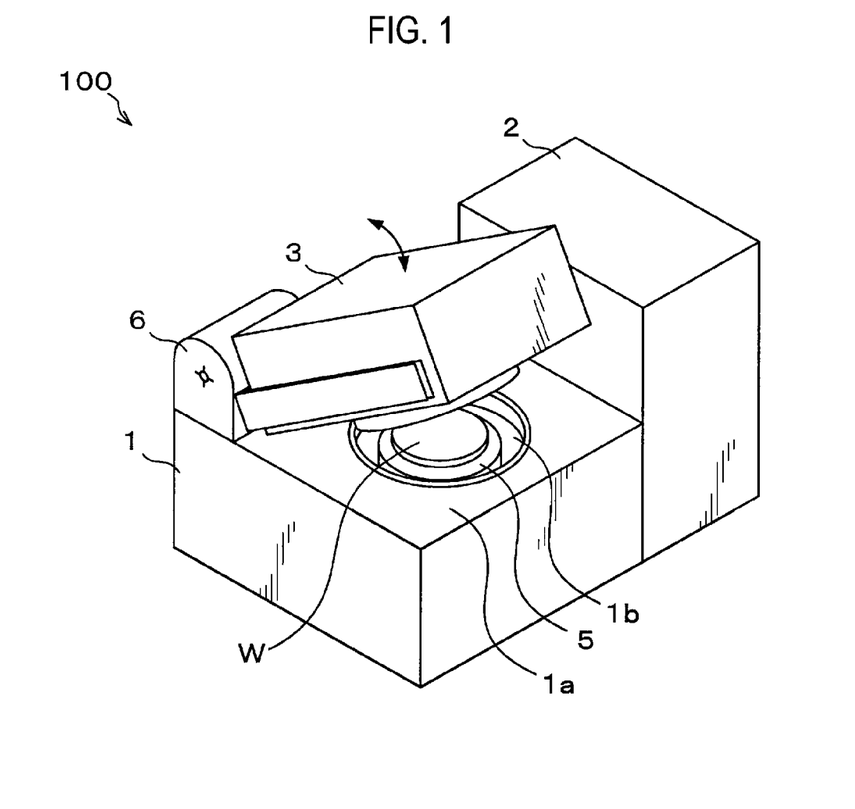
FIG. 1 is a perspective view illustrating an external appearance of a prober as a test device according to an embodiment of the present disclosure.
Figure 2:
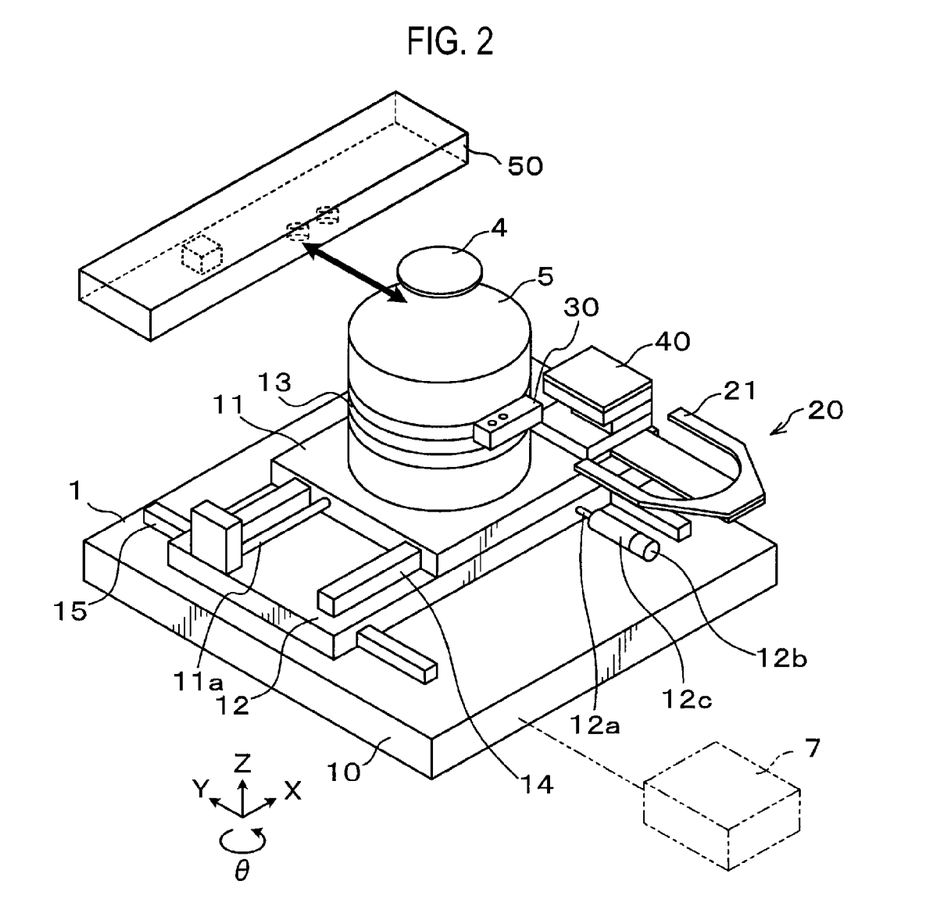
FIG. 2 is a perspective view schematically illustrating an inner structure of a body included in the prober.

Hereinafter, an embodiment of the present disclosure will be described with reference to the drawings. FIG. 1 is a perspective view illustrating an external appearance of a prober 100 as a test device according to an embodiment of the present disclosure. FIG. 2 is a perspective view schematically illustrating an inner structure of the main body 1 included in the prober 100 of FIG. 1, which will be described below.

The prober 100 performs a test of electrical characteristics of a device (not illustrated) such as a semiconductor device formed on a wafer W. The prober 100, as illustrated in FIG. 1, includes a main body 1, a loader 2 disposed to be adjacent to the main body 1, and a test head 3 disposed to cover the main body 1.

The main body 1 is a housing whose interior is hollow, and accommodates a stage 5, on which the wafer W is loaded. An opening 1b is formed on a ceiling part 1a of the main body 1. The opening 1b is positioned above the wafer W loaded on the stage 5, and a substantially disk-shaped probe card holder (not illustrated) is engaged with the opening 1b. The probe card holder holds a disk-shaped probe card 4 of FIG. 2, and the probe card 4 is disposed to face the wafer W positioned on the stage 5 by the probe card holder.

The loader 2 takes out the wafer W accommodated in a FOUP (illustration omitted) that is a transfer container and transfers the taken-out wafer W to the stage 5 of the main body 1. Further, the loader 2 receives the wafer W whose devices have been completely subjected to the test of the electrical characteristics from the stage 5, and accommodates the wafer W in the FOUP.

The test head 3 has a rectangular parallelepiped shape, and is configured to be rotatable upwards by a hinge mechanism 6 provided in the main body 1. The test head 3 is electrically connected to the probe card 4 through a contact ring (not illustrated) while covering the main body 1 from the upper side. The test head 3 has a function of not only storing an electric signal that indicates electrical characteristics of the device, which is transmitted from the probe card 4, as measurement data but also determining presence of an electrical defect of the device on the basis of the measurement data.

As illustrated in FIG. 2, the stage 5 has an X-directional movement unit 11 which moves along the X direction in the drawings, a Y-directional movement unit 12 which moves along the Y direction in the drawings, and a Z-directional movement unit 13 which moves along the Z direction in the drawings. The movement units 11, 12, 13 are disposed on the base 10.

The X-directional movement unit 11 moves the stage 5 in the X direction with a high precision through rotation of a ball screw 11a along a guide rail 14 extending in the X direction. The ball screw 11a is rotated by a motor (not illustrated). Further, the movement amount of the stage 5 may be detected by an encoder (not illustrated) combined with the motor.

The Y-directional movement unit 12 moves the stage 5 in the Y direction with a high precision through rotation of a ball screw 12a along a guide rail 15 extending in the Y direction. The ball screw 12a is rotated by a motor 12b. Further, the movement amount of the stage 5 may be detected by an encoder 12c combined with the motor 12b.

Through the configuration, the X-directional movement unit 11 and the Y-directional movement unit 12 move the stage 5 in the X direction and the Y direction that are perpendicular to each other along a horizontal plane.

The Z-directional movement unit 13 has a motor and an encoder, which are not illustrated, and may detect the movement amount of the stage 5 while moving the stage 5 upwards and downwards along the Z direction. The Z-directional movement unit 13 moves the stage 5 toward the probe card 4 to bring electrodes (pads in the example) of the device on the wafer W and the probe needles into contact with each other. Further, the stage 5 is disposed to be rotatable in the θ direction in the drawings on the Z-directional movement unit 13 by a motor (not illustrated).

The probe card 4 includes a plurality of probe needles 4a (see FIG. 7) on a surface that faces the stage 5. The prober 100 moves the stage 5 in the horizontal direction (the X direction, the Y direction, and the θ direction) and a vertical direction (the Z direction) to adjust a relative position between the probe card 4 and the wafer W and bring the pads of the device and the probe needles 4a into contact with each other. The test head 3 cause a test current to the device through the probe needles 4a of the probe card 4. The probe card 4 transmits an electric signal that indicates electrical characteristics of the device to the test head 3. The test head 3 stores the transmitted electric signal as measurement data, and determines presence of an electrical defect of the device that is a test target. Further, the probe needles 4a may have any shape as long as they contact the pads of the device to be electrically connected to the pads.

A probe card holder exchange unit 20 is disposed in the interior of the main body 1 to be adjacent to the stage 5. The probe card holder exchange unit 20 has a fork 21 that carries the probe card holder (not illustrated) that holds the probe card 4. The fork 21 is configured to be movable in the Y direction and the Z direction, and is used to exchange the probe card 4.

Further, a lower imaging unit 30 and a needle tip polishing unit 40 are disposed between the stage 5 and the probe card holder exchange unit 20 in the interior of the main body 1. The lower imaging unit 30 images the probe needles 4a formed in the probe card 4. The lower imaging unit 30 and the needle tip polishing unit 40 are fixed to the stage 5, and move in the X direction, in the Y direction, and in the Z direction together with the stage 5. A detailed configuration of the lower imaging unit 30 will be described below.

An upper imaging unit 50 is disposed at a position between the stage 5 and the probe card 4 in the vertical direction in the interior of the main body 1. The upper imaging unit 50 images pads of the device formed in the wafer W loaded on the stage 5 or the like. The upper imaging unit 50 is configured to be movable in the Y direction of FIG. 2 by a driving part (not illustrated). A detailed configuration of the upper imaging unit 50 will be described below.

Through the configuration, in the prober 100, the lower imaging unit 30 and the upper imaging unit 50 may be relatively moved to a plurality of positions, such as a position at which the lower imaging unit 30 faces the probe card 4 or a position at which the upper imaging unit 50 faces the stage 5, in addition to a position at which the lower imaging unit 30 and the upper imaging unit 50 face each other.

Further, a target plate 60 (see FIG. 5) is provided in the interior of the main body 1 so as to be positioned between the lower imaging unit 30 and the upper imaging unit 50 in the vertical direction. The target plate 60 is, for example, a transparent glass plate in which a target mark for aligning the positions of the lower imaging unit 30 and the upper imaging unit 50 is formed. The target mark, for example, includes a circular metallic film. Further, the target plate 60 is configured to be movable forwards and rearwards by a forward/rearward movement mechanism with respect to the imaging positions of the lower imaging unit 30 and the upper imaging unit 50. Further, the forward/rearward movement mechanism, that is, the target plate 60 is fixed to the stage 5, and is moved together with the stage 5 in the X direction, in the Y direction, and the Z direction. Further, the target plate 60 is adjusted such that the focusing surface of the lower imaging unit 30 coincides with the target mark when protruding to a position above the lower imaging unit 30.

Further, the prober 100 includes a controller 7 that controls the prober 100. The controller 7, for example, is a computer, and has a program storage unit (not illustrated). The program storage unit stores a program that controls the above-described imaging units, the movement units, or the like, and performs a test on the wafer W, including a test of a needle mark in the prober 100. Further, the program, for example, is recorded in a computer readable memory medium, such as a computer readable hard disk (HD), a flexible disk (FD), a compact disk (CD), a magneto optic disk (MO), or a memory card, and may be installed from the memory medium to the controller 7.

Figure 3:
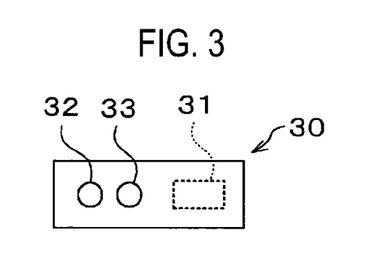
FIG. 3 is a schematic top view of a lower imaging unit.
Figure 4:
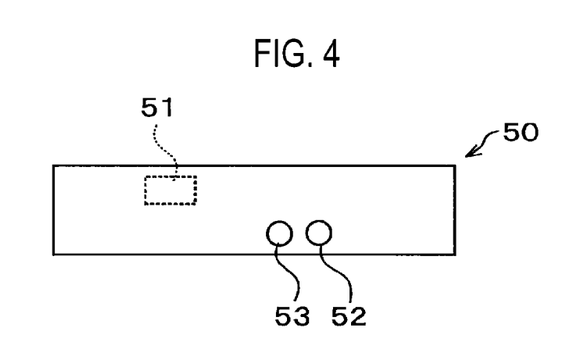
FIG. 4 is a schematic bottom view of an upper imaging unit.

Subsequently, referring to FIG. 2, which has been described above, and FIGS. 3 and 4, which will be described above, detailed configurations of the lower imaging unit 30 and the upper imaging unit 50 will be described. FIG. 3 is a schematic top view of the lower imaging unit 30, and FIG. 4 is a schematic bottom view of the upper imaging unit 50.

The field of view of the lower imaging unit 30 is upward, and the lower imaging unit 30 is provided with respect to the stage 5 such that the focusing surface is positioned to a position above the wafer W on the stage 5, and images the probe needles 4a. The lower imaging unit 30, as illustrated in FIG. 3, has a lower camera 31, a low-resolution optical system including a low-magnification lens 32 for imaging a subject at a low resolution by the lower camera 31, and a high-resolution optical system including a high-magnification lens 33 for imaging a subject at a high resolution by the lower camera 31.

The lower camera 31, for example, is constituted by a complementary metal oxide semiconductor (CMOS) camera. Further, the lower camera 31 may be constituted by a charge coupled device (CCD) camera. The lower camera 31 images the probe needles 4a formed in the probe card 4, and generates image data.

The low-resolution optical system and the high-resolution optical system, which have been described above, has a mirror or a half mirror which guides light from an imaging target of the lower camera 31 to the lower camera 31 in addition to the low-magnification lens 32 or the high-magnification lens 33.

The upper imaging unit 50 is provided above the wafer W on the stage 5 such that the field of view thereof is downward, and images the wafer W and the like. The upper imaging unit 50, as illustrated in FIG. 4, has a upper camera 51, a low-resolution optical system including a low-magnification lens 52 for imaging a subject at a low resolution by the upper camera 51, and a high-resolution optical system including a high-magnification lens 53 for imaging a subject at a high resolution by the upper camera 51.

The upper camera 51 has a binning function; that is, it may optionally perform a binning function of integrating a plurality of adjacent pixels and treating the integrated pixels as a virtual unit pixel. Further, the virtual resolution obtained from imaging through the high-resolution optical system while the binning function is on is lower than the resolution obtained from imaging by the high-resolution optical system while the binning function is off and is higher than the resolution obtained from imaging by the low-resolution optical system while the binning function is off. That is, from the upper camera 51 that images a subject through the high-resolution optical system while the binning function is on, middle-resolution image data are virtually obtained as an output as imaging using a middle-magnification lens. Further, the binning function performed by the upper camera 51, for example, is 2 by 2 binning in which 2 by 2 pixels correspond to one pixel and 3 by 3 binning in which 3 by 3 pixels correspond to one pixel.

Further, the upper camera 51, for example, is constituted by a CMOS camera. Further, the upper camera 51 may be constituted by a CCD camera. The upper camera 51 images a pad of the device formed on a surface of the wafer W, and generates image data. Further, the upper camera 51 images a target mark, and generates image data thereof. The generated image data are output to the controller 7.

The low-resolution optical system and the high-resolution optical system of the upper imaging unit 50 has a mirror or a half mirror that guides light from an imaging target of the upper camera 51 to the upper camera 51 in addition to the low-magnification lens 52 or the high-magnification lens 53.

Subsequently, an example of testing the wafer W using the prober 100 will be described with reference to FIGS. 5 to 8. FIGS. 5 to 8 are views illustrating a process of a probe method according to an embodiment. FIGS. 5 to 8 schematically illustrate a positional relationship between the stage 5, the lower imaging unit 30, the upper imaging unit 50, the probe card 4 (the probe needles 4a), and the wafer W. In FIGS. 5 to 8, reference numeral 201 schematically denotes a light flux between the imaging element of the lower camera 31 and an imaging forming position or an object (the probe needles 4a), and reference numeral 202 schematically denotes a light flux between the imaging element of the upper camera 51 and an imaging forming position or an object (the pads of the device).

(Wafer Transferring Process)

In the test of the embodiment, for example, first, a wafer W that is a test target substrate is taken out from the FOUP of the loader 2, and is transferred to the stage 5. Although not illustrated, devices which are electrical test targets are formed on a surface of the wafer W.

(Camera Position-Aligning Process)

Figure 5:
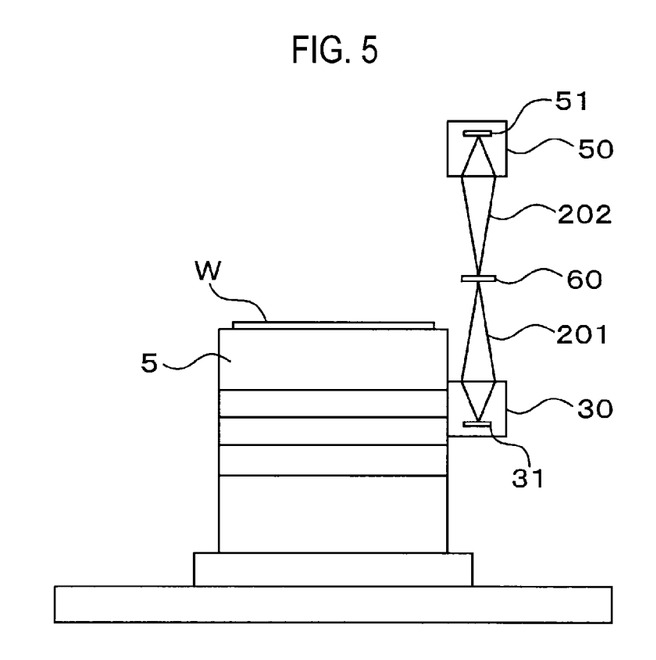
FIG. 5 is a diagram of one process of testing according to an embodiment of the present disclosure.

Subsequently, a camera position-aligning process (an imaging part position-aligning process) of aligning the positions of the lower imaging unit 30 and the upper imaging unit 50 are performed. In detail, as illustrated in FIG. 5, first, the lower imaging unit 30 is moved to a position below the upper imaging unit 50 by moving the stage 5 and the upper imaging unit 50 with respect to each other, and the target plate 60 protrudes to a position above the lower imaging unit 30. Subsequently, the target mark of the target plate 60 adjusted to coincide with the focusing surface of the lower imaging unit 30 as described above is imaged through the high-resolution optical system by the upper camera 51 in a state in which the binning function is off, and image data of a high resolution are output. Further, on the basis of the image data, the stage 5 is moved such that the target mark and the focusing surface of the upper imaging unit 50 coincide with each other. Accordingly, the lower imaging unit 30 and the upper imaging unit 50 are completely aligned in position. The X, Y, and Z coordinates of the stage 5 after the position-alignment, for example, are stored as (X0, Y0, Z0).

After the position-alignment, the target plate 60 is retreated from the position above the lower imaging unit 30.

Further, in the example, the mechanical target mark is imaged, and the position alignment is performed on the basis of the imaging result. Instead, as disclosed in Japanese Patent Application Publication No. 2016-111175, the optical target mark is projected to the imaging elements of the lower imaging unit 30 and the upper imaging unit 50 at the same time, and the lower imaging unit 30 and the upper imaging unit 50 may be aligned in position on the basis of the imaging data obtained accordingly.

(Reference Position Information Acquiring Process)

On the basis of the imaging result through the low-resolution optical system and the imaging result through the high-resolution optical system in the upper imaging unit 50, a position-alignment in the θ direction of the wafer W is performed and information on a plurality of reference positions (for example, 5 points) of the wafer W is obtained (a reference position information acquiring process).

Figure 6:
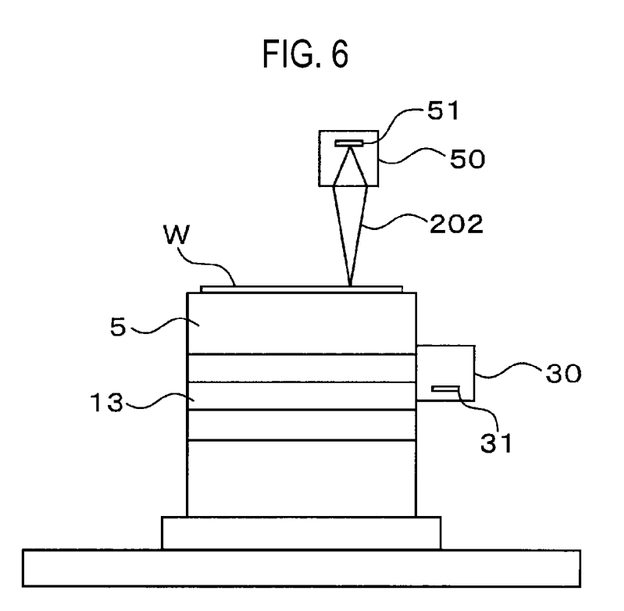
FIG. 6 is a diagram of another process of testing according to an embodiment of the present disclosure.

In detail, for example, as illustrated in FIG. 6, the stage 5 and the upper imaging unit 50 are moved with respect to each other such that the wafer W on the stage 5 is positioned on a position below the upper imaging unit 50. Subsequently, the wafer W is imaged through the low-resolution optical system by the upper camera 51, and for example, approximate positions of two points among the plurality of reference positions, are determined on the basis of the imaging result. At this time, the binning function may be on or off. Further, the reference position, for example, is a predetermined pad. Subsequently, the determined positions on the wafer W is imaged through the high-resolution optical system by the upper camera 51 in a state in which the binning function is off, the two points are recognized on the image on the basis of the imaging result, the deviation of the wafer W in the θ axis direction is calculated on the basis of the recognized positions, and the position-alignment of the wafer W in the θ axis direction is performed by moving the stage 5 in the θ direction on the basis of the calculation result.

Subsequently, the wafer W is imaged through the low-resolution optical system by the upper camera 51, and the approximate positions of the five approximate positions are determined on the basis of the imaging result. At this time, the binning function may be on or off. Subsequently, the determined position on the wafer W is imaged through the high-magnification lens 53 by the upper camera 51 in a state in which the binning function is off, the reference positions are recognized on the image on the basis of the imaging result, and the positional coordinates (X1, Y1, Z1) are calculated and stored. Here, the positional coordinates of the reference positions will be denoted by (X1, Y1, Z1) for convenience' sake.

(Probe Needle Position-Aligning Process)

Information on the positions of the probe needles is acquired on the basis of the imaging result through the low-resolution optical system and the imaging result through the high-resolution optical system in the lower imaging unit 30 (a probe needle position-aligning process).

Figure 7:
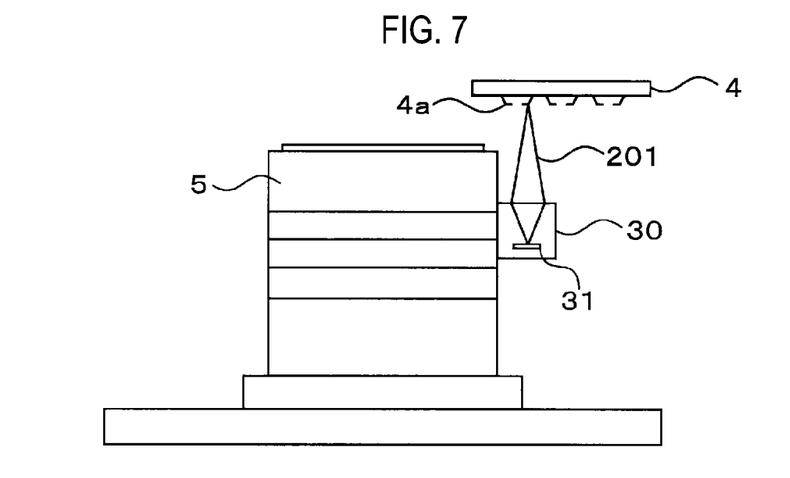
FIG. 7 is a diagram of another process of testing according to an embodiment of the present disclosure.

In detail, for example, the upper imaging unit 50 is retreated from the position below the probe needles 4a by moving the stage 5 relatively, and as illustrated in FIG. 7, the lower imaging unit 30 is positioned in a position below the probe card 4. Further, the probe needles 4a are imaged through the low-resolution optical system by the lower camera 31 of the lower imaging unit 30, and on the basis of the imaging result, an approximate position of a predetermined probe needle 4a, among the probe needs 4a, is determined. Subsequently, a vicinity of the determined approximate position of the probe needle 4a is imaged through the high-resolution optical system by the lower camera 31, and on the basis of the imaging result, the lower imaging unit 30 fixed to the stage 5 is moved in the X direction, in the Y direction, and in the Z direction such that the focus of the lower camera 31 coincides with the predetermined probe needle 4a. The X, Y, and Z coordinates of the stage 5 after the movement, for example, are stored as (X3, Y3, Z3).

Through the camera position-aligning process, the reference position information acquiring process, and the probe needle position-aligning process, the relative positions of the plurality of imaging positions on the wafer W and the probe needles 4a may be precisely recognized from the positional coordinates. The positional coordinates, for example, may be managed by the number of pulses of the encoders in the X, Y, and Z directions with respect to the case in which the stage 5 is positioned at a predetermined standard position. Further, the performance sequence of the camera position-aligning process, the reference position information acquiring process, and the probe needle position-aligning process does not matter.

(Electrical Test Process)

After the camera position-aligning process, the reference position information acquiring process, and the probe needle position-aligning process, the pads on the wafer W and the probe needles 4a are brought into contact with each other to test electrical characteristics of the device including the pads.

Figure 8:
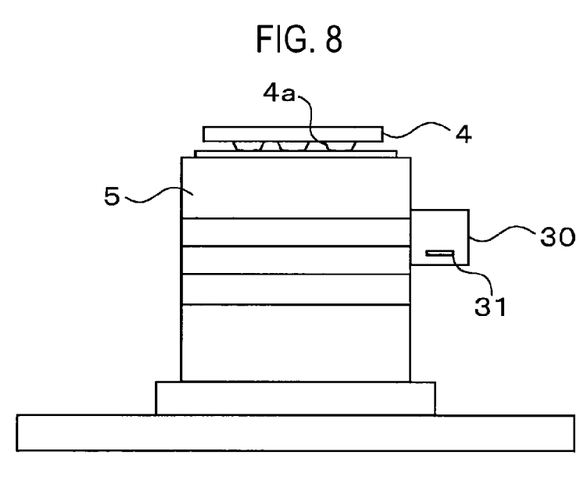
FIG. 8 is a diagram of another process of testing according to an embodiment of the present disclosure.

In detail, on the basis of the positional coordinates obtained in the camera position-aligning process, the reference position information acquiring process, and the probe needle position-aligning process, as illustrated in FIG. 8, the stage 5 is moved in the X direction and in the Y direction such that the probe needles 4a and the pads of the device formed on the surface of the wafer W coincide with each other. Thereafter, the electrical characteristics of the device are tested by bringing the probe needles 4a into contact with the electrodes by moving the stage 5 in the Z direction. Thereafter, the above-described process is repeated until all the devices are completely tested.

(High-Speed Low-Precision Needle Mark Testing Process)

After the electrical test process, the pad after the probe needle 4a is contacted is imaged by the upper camera 51 while the binning function is on, and on the basis of the binning image data output from the upper camera 51, which are image data when the binning function is on, the states of the needle marks are determined for respective pads.

In detail, on the basis of the positional coordinates obtained in the camera position-aligning process and the reference position information acquiring process, as in FIG. 6, the stage 5 is moved in the X, Y, and Z directions such that a predetermined region on the surface of the wafer W and the position of the optical axis of the upper imaging unit 50 coincide with each other. Further, the predetermined region of the wafer W is imaged through the high-resolution optical system by the upper camera 51 while the binning function is on, and based on the binning image data output from the upper camera 51, the state of the needle mark on the pad included in the image given by the binning image data are determined for respective pads.

Thereafter, the above-described process is repeated until the entire surface of the region of the wafer W on which the pads are formed is completely imaged, and the states of the needle marks for the entire pads are completely determined.

As determination in the high-speed low-precision needle mark testing process, it is determined for the respective pads whether the needle mark is good, a retest is necessary, or the needle marks are bad.

For example, as imaging results, when a predetermined number of needle marks, which have a size, i.e., an area being within a predetermined range, are recognized in a predetermined region on a pad, it is determined that the needle mark is good for the pad. Further, for example, the pad is quadrangle having one side of 30 µm to 200 µm, the predetermined region is a region spaced apart from an end of the pad by 5 µm to 50 µm, the predetermined range of the area of the needle marks is 1 µm² to 400 µm², and the predetermined number of the needle marks is 1 to 10.

When a needle mark is recognized at a portion other than the pad, for example, a needle mark is recognized in a protection film around the pad after the imaging result, it is determined that the needle mark is bad for the pad. When the size of the needle mark recognized in the predetermined region of the pad is not in the predetermined range, and is excessively large or excessively small, it is also determined that the needle mark is bad for the pad.

After the imaging result, when a needle mark is not recognized, or when the number of the needle marks recognized in the predetermine region of the pad does not coincide with the predetermined number, i.e., the number the probe needle 4a contact with the pad, it is determined that it is necessary to retest the pad. Further, when a needle mark is recognized in a border portion of the pad or the needle mark recognized in the predetermined region of the pad is thin, it is determined that it is necessary to retest the pad. Further, determination in the high-speed low-precision needle mark testing process may be performed using pattern matching.

When the entire pads are determined not to need a retest, the test according to the embodiment is ended. When it is determined that it is necessary to retest a portion of the pads, the low-speed high-precision needle mark testing mark, which will be described below, is performed. Further, when it is determined that a needle mark for a certain pad is bad, the test of the needle mark for the wafer W is stopped, for example, the test according to the embodiment may be ended.

(Low-Speed High-Precision Needle Mark Testing Process)

The pad determined to be necessary to retest in the high-speed low-precision needle mark testing process is imaged by the upper camera 51 while the binning function is off, and on the basis of the standard image data which are image data when the binning function is off, which have been output from the upper camera 51, the states of the needle marks of the pads are determined for respective pads.

In detail, on the basis of the positional coordinates obtained in the camera position-aligning process and the reference position information acquiring process, the stage 5 is moved in the X, Y, and Z directions such that a predetermined region of the wafer W including a pad determined to be necessary to retest and the position of the optical axis of the upper imaging unit 50 coincide with each other. Further, the predetermined region of the wafer W is imaged through the high-resolution optical system by the upper camera 51 while the binning function is off, and based on the standard image data output from the upper camera 51, the states of the needle marks on the pad included in the image given by the image data are determined. The determination target here, for example, only the pads which are determined to be necessary to retest.

Thereafter, when a plurality of pads determined to be necessary to retest exists, the above-described process is repeated until the retest of all the needle marks for the pad is completed.

In the determination of the low-speed high-precision needle mark testing process, it is determined whether the needle marks are good or bad for the pad determined to be necessary to retest.

For example, as imaging results, when a predetermined number of needle marks, which have a size, i.e., an area being within a predetermined range, are recognized in a predetermined region on a pad, it is determined that the needle mark is good for the pad.

When a needle mark is recognized at a portion other than the predetermined region of the pad as an imaging result, it is determined that the needle mark for the pad is bad. When the size of the needle mark recognized in the predetermined region of the pad is not in the predetermined range, it is also determined that the needle mark is bad for the pad. Further, when there is no needle mark or when the number of needle marks recognized in the predetermined region of the pad does not coincide with the predetermined number, it is determined that the needle mark for the pad is bad.

If the low-speed high-precision needle mark testing process is completed, the test according to the embodiment is ended. Further, the test result of the electrical characteristics of the device or the test result of the needle mark test, for example, may be output to be displayed on the display device.

As described above, because the prober 100 according to the embodiment includes the upper camera 51 having a binning function, the states of the needle marks based on the binning image data are determined for respective pads, and the states of the needle marks are retested on the basis of the standard image data of a high resolution only for the pad determined to be necessary to retest. Accordingly, while the amount of processing required for the test is suppressed, a test of needle marks with a high precision may be performed. Further, because the amount of processing is suppressed, the entire prober 100 may become inexpensive as it is not necessary to use the controller with a high capacity.

Further, because a plurality of optical systems are not used to test needle marks, an enlargement of the upper imaging unit 50 can be avoided. Accordingly, even though the main body 1 of the prober 100 is a small size, the upper imaging unit 50 can be disposed between the probe card 4 and the stage 5. Further, because a plurality of optical systems are not used and thus it is not necessary to switch the optical system during the needle mark test, the reliability of the prober 100 is high as a physical mechanism for the switching is not necessary. Further, because the above-described physical mechanism is not necessary, the maintenance for the mechanism or the like can be omitted. Further, because the above-described physical mechanism is not necessary, costs can be reduced.

In the above example, in the camera position-aligning process, the target mark is imaged through the high-resolution optical system by the upper camera 51 in the state in which the binning function is off, and the lower imaging unit 30 and the upper imaging unit 50 are aligned in position on the basis of the imaging result. Instead, the target mark may be imaged through the high-resolution optical system by the upper camera 51 in the state in which the binning function is on, and the position-alignment may be made on the basis of the imaging result. This is because the imaging of the target mark does not require a high resolution. By such configuration, the amount of processing in the camera position-aligning process may be reduced.

Further, although two optical systems of a high-resolution optical system and a low-resolution optical system are provided in the lower imaging unit 30 in the above example, the optical system provided in the lower imaging unit 30 may be one optical system by allowing the lower camera 31 to include the binning function. Further, a probe needle position-aligning process may be performed by using the binning function of the lower camera 31.

In this case, in the probe needle position-aligning process, the probe needles 4a are imaged through one optical system provided in the lower imaging unit 30 by the lower camera 31 in which the binning function is on, and an approximate position of a predetermined probe needle 4a among the probe needles 4a is determined based on the imaging result. Subsequently, the vicinity of the determined approximate position of the predetermined probe needle 4a is imaged through the optical system by the lower camera 31 in which the binning function is off. Further, based on the imaging result, the lower imaging unit 30 fixed to the stage 5 is moved in the X, Y, and Z directions such that the focus of the lower camera 31 coincides with the predetermined probe needle 4a. The coordinates X, Y, Z of the stage 5 after the movement is stored.

In this way, because the number of the optical systems may be reduced by providing a binning function to the lower camera 31, low costs may be achieved.

Further, the high-speed low-precision needle mark testing process and the low-speed high-precision needle mark testing process may not be performed for each wafer W, and may be performed repeatedly skipping several sheets of wafers W or only for the first one sheet of wafer W of each rot.

The following foreign substance presence determining process may be included in the test according to the embodiment.

In the foreign substance presence determining process, before the wafer transferring process, a mounting surface of the wafer W of the stage 5 as a loading stand is imaged through the high-resolution optical system by the upper camera 51 in the state in which the binning function is on, and presence of the foreign substances on the mounting surface is determined on the basis of the imaging result.

Further, when the test is performed on a wafer of a low reflectivity, the binning function may be on in the reference position information acquiring process.

The image of the wafer of a low reflectivity is dark as a whole, and a brighter image may be obtained by brightening the illumination, but S/N ratio deteriorates. In contrast, a brighter image may be obtained without deteriorating the S/N ratio by making the binning function valid, thereby lowering a possibility of misrecognizing a wafer by the naked eye or software. Further, the recognition process of the wafer by software can become faster.

Further, although the electrode of the test target is a pad in the above description, it may be a bump electrode.

Further, the test object is not limited to a semiconductor wafer, and for example, may be a flat panel display, which is representatively referred to as a glass substrate, used for a liquid crystal display device.

Although the suitable embodiments have been described with reference to the accompanying drawings, the present disclosure is not limited to the examples. It is apparent to an ordinary person in the art to which the present disclosure pertains that various modifications or corrections may be made, and it is understood that the modifications or the corrections also fall within the technical scope of the present disclosure.

INDUSTRIAL USE OF THE PRESENT INVENTION

The present disclosure is useful for the technology for testing a needle mark generated in an electrode formed in a test object when a probe needle contacts the electrode.

EXPLANATION OF REFERENCE NUMERALS

1: main body
2: loader
3: test head
4: probe card
4a: probe needle
5: stage
7: controller
10: base
11: X-direction movement unit
12: Y-direction movement unit
13: Z-direction movement unit
30: lower imaging unit
31: lower camera
32: low-magnification lens
33: high-magnification lens
50: upper imaging unit
51: upper camera
52: low-magnification lens
53: high-magnification lens
60: target plate
100: prober

What is claimed is:

1. A test device for testing a needle mark generated in an electrode formed in a test object when a probe needle contacts the electrode, the test device comprising:
   an imaging part having a binning function; and
   a controller configured to control at least the imaging part, wherein the controller is configured to perform:

a high-speed low-precision test process of imaging the electrode, after a contact operation by the probe needle, by the imaging part whose binning function is on, and determining a state of the needle mark of the electrode, based on an imaging result; and a low-speed high-precision test process of imaging the electrode again by the imaging part whose binning function is off, according to a determination result in the high-speed low-precision test process, and determining a state of the needle mark of the electrode imaged again, based on an imaging result.

2. The test device of claim 1, wherein in the low-speed high-precision test process, among electrodes that are targets of the determination of the state of the needle mark in the high-speed low-precision test process, only electrodes selected according to the determination result in the high-speed low-precision test process become targets of the determination of the state of the needle mark.

3. The test device of claim 2, wherein the selected electrodes are electrodes that are determined to be required to be retested in the high-speed low-precision test process.

4. The test device of claim 1, wherein in the high-speed low-precision test process, it is determined whether the needle mark of the electrode is good, a retest of the electrode is necessary, or the needle mark of the electrode is bad, and wherein in the low-speed high precision test process, it is determined whether the needle mark of the electrode is good or the needle mark of the electrode is bad.

5. The test device of claim 4, wherein in the high-speed low-precision test process, when a predetermined number of needle marks, which have an area being within a predetermined range, are recognized in a predetermined region of the electrode, it is determined that the needle mark is good for the electrode.

6. The test device of claim 4, wherein in the high-speed low-precision test process, when the needle mark is not recognized, when the number of the needle marks recognized in a predetermined region of the electrode is not the same as the predetermined number, when the needle mark is recognized at a border portion of the electrode, or when the needle mark recognized in a predetermined region of the electrode is thin, it is determined that it is necessary to retest the electrode.

7. The test device of claim 4, wherein in the high-speed low-precision test process, when the needle mark is recognized at a portion other than the electrode, or when an area of the needle mark recognized in a predetermined region of the electrode is not in the predetermined range, it is determined that the needle mark of the electrode is bad.

8. The test device of claim 4, wherein in the low-speed high-precision test process, when a predetermined number of needle marks, which have an area being within a predetermined range, are recognized in a predetermined region of the electrode, it is determined that the needle mark of the electrode is good.

9. The test device of claim 4, wherein in the low-speed high-precision test process, when the needle mark is recognized at a portion other than the predetermined region of the electrode, when an area of the needle mark recognized in the predetermined region of the electrode is not in a predetermined range, when the needle mark is not recognized, or when the number of the needle marks recognized in the predetermined region of the electrode does not coincide with the predetermined number, it is determined that the needle mark of the electrode is bad.

10. The test device of claim 1, further comprising:
a low-resolution optical system for imaging by the imaging part at a resolution lower than a virtual resolution that is available when the binding function is on,
wherein the controller is configured to perform:
a reference position information acquiring process of acquiring information on a reference position of the test object, based on an imaging result of imaging the test object by the imaging part through the low-resolution optical system, and an imaging result of imaging the test object by the imaging part through an optical system that is not the low-resolution optical system.

11. The test device of claim 1, wherein the controller is configured to:
image a stage, on which the test object is loaded, by the imaging part while the binning function is on, and determine presence of foreign substances on the stage, based on an imaging result.

12. The test device of claim 1, wherein the test device is a probe device configured to test the test object by bringing the probe needle into contact with the electrode formed in the test object and supplying an electric signal to the test object through the probe needle, and further comprises a separate imaging part configured to image the probe needle, and
wherein the controller is configured to perform:
an imaging part position-aligning process of imaging a target mark for aligning positions of the imaging part and the separate imaging part by the imaging part while the binning function is on, and aligning the positions of the imaging part and the separate imaging part, based on an imaging result.

13. The test device of claim 1, wherein the test device is a probe device configured to test the test object by bringing the probe needle into contact with the electrode formed in the test object and supplying an electric signal to the test object through the probe needle, and further comprises a separate imaging part configured to image the probe needle, and
wherein the controller is configured to perform:
an imaging part position-aligning process of aligning positions of the imaging part and the separate imaging part, based on an output from the imaging part, the output being imaged while the binning function is on.

14. A test method using a test device for testing a needle mark generated in an electrode formed in a test object when a probe needle contacts the electrode, the test device including an imaging part having a binning function, the test method comprising:
a high-speed low-precision test process of imaging the electrode, after a contact operation by the probe needle, by the imaging part whose the binning function is on, and determining a state of the needle mark of the electrode, based on an imaging result; and
a low-speed high-precision test process of imaging the electrode again by the imaging part whose binning function is off, according to a determination result in the high-speed low-precision test process, and determining a state of the needle mark of the electrode imaged again, based on an imaging result.

15. A non-transitory computer readable memory medium that stores a program that is operated on a computer of a controller that controls a test device such that a test method is executed by the test device, the test device including an imaging part having a binning function, the test method using a test device for testing a needle mark generated in an electrode formed in a test object when a probe needle contacts the electrode, the test method comprising:

a high-speed low-precision test process of imaging the electrode, after a contact operation by the probe needle, by the imaging part whose the binning function is on, and determining a state of the needle mark of the electrode, based on an imaging result; and a low-speed high-precision test process of imaging the electrode again by the imaging part whose binning function is off, according to a determination result in the high-speed low-precision test process, and determining a state of the needle mark of the electrode imaged again, based on an imaging result.

16. A test device for testing a test object by bringing a probe needle into contact with an electrode formed in the test object and supplying an electric signal to the test object through the probe needle, the test device comprising:

an imaging part having a binning function; and an optical system for imaging by the imaging part at a resolution lower than an virtual resolution that is available when the binning function is on.

* * * * *